(12) United States Patent
Weidinger et al.

(10) Patent No.: US 11,749,613 B2
(45) Date of Patent: Sep. 5, 2023

(54) COMPONENT WITH DIELECTRIC LAYER FOR EMBEDDING IN COMPONENT CARRIER

(71) Applicant: AT&S Austria Technologie & Systemtechnik Aktiengesellschaft, Leoben (AT)

(72) Inventors: Gerald Weidinger, Leoben (AT); Andreas Zluc, Leoben (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 17/451,012

(22) Filed: Oct. 15, 2021

(65) Prior Publication Data

US 2022/0037262 A1 Feb. 3, 2022

Related U.S. Application Data

(63) Continuation of application No. 16/559,399, filed on Sep. 3, 2019, now Pat. No. 11,171,092.

(30) Foreign Application Priority Data

Sep. 10, 2018 (EP) ..................................... 8193535

(51) Int. Cl.
*H01L 23/538* (2006.01)
*H01L 23/31* (2006.01)
(Continued)

(52) U.S. Cl.
CPC ...... *H01L 23/5389* (2013.01); *H01L 21/4853* (2013.01); *H01L 21/565* (2013.01);
(Continued)

(58) Field of Classification Search
CPC ............. H01L 23/5389; H01L 23/3121; H01L 23/373; H01L 23/5386; H01L 24/19;
(Continued)

(56) References Cited

U.S. PATENT DOCUMENTS 6,309,912 B1 10/2001 Chiou et al.
8,354,338 B2 1/2013 Hu et al.
(Continued)

FOREIGN PATENT DOCUMENTS

CN 108364921 A 8/2018
WO 2015026344 A1 2/2015
WO 2016176512 A1 11/2016

OTHER PUBLICATIONS

Kästner, M.; Communication in Application No. 18 193 535.4; pp. 1-5; dated Jun. 4, 2021; European Patent Office, Postbus 5818, 2280 HV Rijswijk, Netherlands.
(Continued)

*Primary Examiner* — Shahed Ahmed
(74) *Attorney, Agent, or Firm* — Robert A. Blaha; Smith Tempel Blaha LLC

(57) ABSTRACT

A method for manufacturing a component carrier includes forming a stack with at least one electrically insulating layer structure and/or at least one electrically conductive layer structure, providing a component having one or more pads and at least one dielectric layer on at least one main surface of the component such that the dielectric layer at least partially covers one or more pads of the component, placing the component on a temporary carrier, and embedding the component between the temporary carrier and the at least one insulating layer structure by pressing the component into the at least one insulating layer structure.

13 Claims, 9 Drawing Sheets

(51) Int. Cl.
  *H01L 23/373* (2006.01)
  *H01L 23/00* (2006.01)
  *H01L 21/48* (2006.01)
  *H01L 21/56* (2006.01)

(52) U.S. Cl.
  CPC ........ *H01L 21/568* (2013.01); *H01L 23/3121* (2013.01); *H01L 23/373* (2013.01); *H01L 23/5386* (2013.01); *H01L 24/19* (2013.01); *H01L 24/20* (2013.01); *H01L 2224/214* (2013.01)

(58) Field of Classification Search
  CPC . H01L 21/4853; H01L 21/568; H01L 21/565; H01L 24/20; H01L 23/498–49894; H01L 23/538–5389; H01L 21/4846–4867; H01L 21/4807–481
  See application file for complete search history.

(56) References Cited

U.S. PATENT DOCUMENTS

| | | |
|---|---|---|
| 2003/0013232 A1 | 1/2003 | Towle et al. |
| 2005/0028925 A1 | 2/2005 | Fernandes et al. |
| 2006/0145328 A1 | 7/2006 | Hsu |
| 2009/0267171 A1 | 10/2009 | Yean et al. |
| 2010/0044845 A1 | 2/2010 | Funaya et al. |
| 2012/0060908 A1 | 3/2012 | Crafts |
| 2012/0313226 A1 | 12/2012 | Koizumi et al. |
| 2013/0200534 A1* | 8/2013 | Shiobara ............. H01L 23/3135 428/447 |
| 2013/0337648 A1 | 12/2013 | Lin et al. |
| 2014/0138758 A1* | 5/2014 | Uozaki ................. H01L 27/105 257/317 |
| 2014/0252641 A1* | 9/2014 | Lim ........................ H01L 24/19 438/618 |
| 2015/0008587 A1 | 1/2015 | Lin et al. |
| 2016/0020110 A1* | 1/2016 | Lu ........................... H01L 29/78 257/618 |
| 2016/0155702 A1 | 6/2016 | Chen |
| 2018/0040551 A1 | 2/2018 | Lin et al. |
| 2018/0082988 A1 | 3/2018 | Cheng et al. |
| 2018/0315647 A1* | 11/2018 | Wang ................ H01L 21/76865 |
| 2019/0148301 A1 | 5/2019 | Huang et al. |
| 2020/0098886 A1* | 3/2020 | Liu ....................... H01L 21/764 |

OTHER PUBLICATIONS

Natanni, F.; Extended European Search Report in Application No. 18 193 535.4; pp. 1-9; dated Jan. 8, 2019, European Patent Office, 80298, Munich, Germany.

First Office Action in Application No. 201910851934.9; pp. 1-7; dated Mar. 6, 2023, China National Intellectual Property Administration; 6 Xitucheng Lu, Jimenqiao, Haidian District, Beijing 100088, China.

* cited by examiner

COMPONENT WITH DIELECTRIC LAYER FOR EMBEDDING IN COMPONENT CARRIER

CROSS-REFERENCE TO RELATED APPLICATION

This application is a continuation of U.S. patent application Ser. No. 16/559,399, which claimed priority to the filing date of the European patent application no. 18 193 535.4 filed Sep. 10, 2018, which is incorporated herein by reference in its entirety.

TECHNICAL FIELD

The invention relates to a method of manufacturing a component carrier and to a component carrier.

TECHNOLOGICAL BACKGROUND

In the context of growing product functionalities of component carriers equipped with one or more electronic components and increasing miniaturization of such components as well as a rising number of components to be mounted on or embedded in the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions.

In particular, efficiently embedding a component in a component carrier is an issue.

SUMMARY

There may be a need to efficiently embed a component in a component carrier.

According to an exemplary embodiment of the invention, a component carrier is provided which comprises a stack comprising at least one electrically insulating layer structure and/or at least one electrically conductive layer structure, a component (or multiple components) having one or more pads and at least one dielectric layer on at least one main surface of the component, wherein the at least one dielectric layer does not extend beyond the main surface in a lateral direction, wherein the dielectric layer at least partially covers the one or more pads of the component, and at least one electrically conductive contact extending through at least one opening in the dielectric layer up to at least one of the one or more pads.

According to another exemplary embodiment of the invention, a method of manufacturing a component carrier is provided, wherein the method comprises forming a stack comprising at least one electrically conductive layer structure and/or at least one electrically insulating layer structure, embedding a component in the stack, wherein the component comprises at least one dielectric layer arranged on at least one main surface of the component and at least partially covering one or more pads of the component, and forming at least one opening in the dielectric layer and at least partially filling the at least one opening with at least one electrically conductive contact to thereby electrically connect at least one of the one or more pads of the component.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "dielectric layer" may particularly denote a layer covering at least part of a surface of a component and comprising or even consisting of an electrically insulating material. Such a dielectric layer may be applied as a coating or an attached film to the component and may cover a part of or even entire pads of the component via which one or more pads the component can be electrically contacted. The dielectric layer may be a flat foil covering one or two opposing main surfaces of the component. Side walls of the component may or may not be covered by the dielectric layer. The dielectric layer may also be a closed shell fully circumferentially covering the component.

In the context of the present application, the term "dielectric layer which does not extend beyond the main surface of a component in a lateral direction" may particularly denote that the dielectric layer only covers the surface of the component and does not extend significantly beyond lateral ends of the component. While the dielectric layer may optionally also cover a sidewall of the component connected to a main surface at an angle (in particular at a right angle), the dielectric layer of such an embodiment shall not laterally protrude significantly beyond such a sidewall, in particular not over a dimension being larger than a thickness of the dielectric layer.

According to an exemplary embodiment of the invention, a component carrier is provided which has a component with one or more pads on a surface of the component which is covered with a dielectric layer being formed on the component already before embedding the component in a layer stack of the component carrier. By taking this measure, the component may be already prepared for proper electric contacting prior to the embedding procedure, so that after embedding the component in the (preferably laminated) layer stack of electrically conductive layer structures and/or electrically insulating layer structures, the obtained body does not necessarily be covered by a further electrically insulating layer structure in a separate lamination process prior to exposing the one or more pads of the component for contacting. By correspondingly configuring the dielectric layer (in particular by correspondingly adjusting material and/or thickness thereof), it may be thus possible to keep a number of lamination procedures for manufacturing the component carrier small. At the same time, also the entire thickness of the component carrier may be kept very compact. Also, the embedding height of the component can be precisely adjusted by correspondingly designing the mentioned dielectric layer. As a result, a simple manufacturability of the component carrier may be combined with a thin and compact shape thereof.

In the following, further exemplary embodiments of the method and the component carrier will be explained.

In an embodiment, a bottom surface of the dielectric layer is at the same vertical level and in alignment with a bottom surface of the stack. In particular when the component is located in a cavity of the stack, the dielectric layer thereof may be located entirely within the cavity so that its bottom surface flushes with a bottom surface of the stack. This provides a particularly compact architecture in vertical direction.

In an embodiment, the dielectric layer comprises at least one of the group consisting of resin, in particular epoxy resin, a photo-imageable dielectric, and polyimide. Using a resin, in particular epoxy resin, as a material for the dielectric layer renders the coated or covered component particularly appropriate for component carrier technology, in particular PCB (printed circuit board) technology. The reason for this is that in PCB technology, such resin materials are also used as well, so that issues such as a thermal mismatch in terms of different values of the coefficient of thermal expansion of dielectric material of the component carrier, dielectric material bridges, etc. may be safely prevented. Moreover, such component carrier material can be properly processed by laser drilling, mechanically drilling, etc. as well as is compatible with copper filling. When a photo-imagable dielectric (such as a photoresist) is used as material for the dielectric layer, patterning the dielectric layer by a photoimaging process becomes possible. This simplifies the process of exposing the at least partially covered pad(s) of the component for establishing an electric contact with an environment. When the dielectric layer is made of a photo-imagable material, it may for instance comprise or consist of a photoresist. Also, the use of polyimide as material for the dielectric layer is advantageous, since also this material can be properly processed by laser or mechanically drilling and is compatible with copper plating technology.

In an embodiment, the dielectric layer is made of a copper-plateable material. Hence, the dielectric layer may be capable of serving as a support for plated copper deposited on the dielectric layer and/or in one or more openings extending therethrough.

In an embodiment, the dielectric layer is made of a thermally conductive material, in particular having a value of the thermal conductivity of at least 1 W/mK. When the material of the dielectric layer is made of a highly thermally conductive material (in particular having a higher thermal conductivity than prepreg), the dielectric layer may also significantly contribute to the removal of heat generated by the component in an interior of the component carrier during operation. For instance, when the component is a semiconductor chip such as a processor, a considerable amount of heat may be generated in an interior of the component carrier and needs to be re-moved therefrom in order to prevent undesired effects such as overheating or thermal loads. Such a heat removal or heat spreading in the plate type component carrier may be promoted by a dielectric layer made of a properly thermally conductive material.

In an embodiment, the dielectric layer is made of a laser drillable material. When the dielectric layer is made of a material which can be drilled by a laser, the openings may be easily and precisely manufactured by laser drilling. This further improves the compatibility of the component coated or covered with the dielectric layer with PCB technology.

In an embodiment, a thickness of the dielectric layer is in a range between 0.5 µm and 100 µm, in particular in a range between 10 µm and 20 µm. On the one hand, the dielectric layer should not be too thin in order to prevent undesired uncoated regions of the component which might deteriorate the electric performance of the component carrier. On the other hand, the dielectric layer should not be too thick in order to keep the manufactured component carrier thin in a vertical direction. The mentioned ranges have turned out as a proper trade-off between these and other considerations.

In an embodiment, the at least one electrically conductive contact comprises at least one of the group consisting of a via, in particular at least one of a laser via, a photo via and a plasma via, filled at least partially with electrically conductive material, and a metallic pillar, in particular a copper pillar. Thus, the external electric coupling of the embedded component may be accomplished by vias (in particular laser vias) formed and extending vertically through the dielectric layer. Additionally or alternatively, it is also possible to use metal pillars, i.e. metallic posts, extending through the dielectric layer for contacting the pad(s) of the component.

In an embodiment, the component has one or more pads under a respective dielectric layer on each of two opposing main surfaces of the component, wherein each respective dielectric layer at least partially covers the respective one or more pads on the respective main surface of the component. In such an embodiment, both opposing main surfaces of the component may be covered with a respective dielectric layer and may have pads on both of these two opposing main surfaces. This renders even sophisticated contact architectures possible. It is also possible that the entire circumferential surface of the component is covered with dielectric layer material, for instance by dipping the entire component in a liquid precursor for such a dielectric material. Alternatively, only the mentioned two opposing main surfaces may be covered partially or entirely with a respective dielectric layer, for instance by adhering sticky foils as dielectric layers to the main surfaces. In yet another embodiment, only one main surface of the component may be covered with the mentioned dielectric layer to keep the thick-ness of the component as thin as possible.

In an embodiment, the method comprises forming the at least one electrically conductive contact without previously connecting at least one further electrically insulating layer structure to the at least one dielectric layer. Thus, it may be dispensable to attach one or more further electrically insulating layer structures to a bottom surface of both the stack and the embedded component before exposing the pads of the component with respect to an exterior electronic environment of the laminate-type component carrier. This renders the manufacturing process quick and easy and allows obtaining component carriers with very small vertical thickness.

In an embodiment, the component is already provided with the at least one opening at the point of time of embedding the component. There-fore, the component with the one or more dielectric layers may already be provided with one or more openings which expose the pad(s) at the point of time of embedding the component in the stack. Thus, a later opening or exposing of the pads of the component by forming openings extending through the dielectric layer may become dispensable. Forming these access holes or openings may be easy when conditioning the still isolated or separate component.

In an embodiment, the method comprises at least partially filling the at least one opening with electrically conductive material after embedding the component. For instance, this filling procedure may be accomplished by plating, in particular copper plating.

In an embodiment, the method comprises forming the at least one opening by laser processing, in particular laser drilling. Laser drilling is a process which allows the formation of openings with high precision and in a short time.

In an embodiment, the method comprises providing the stack with a cavity, closing at least part of a bottom of the cavity by a temporary carrier, and placing the component in the cavity so that at least one of the at least one dielectric layer is attached onto the temporary carrier. In such an embodiment, the cavity may be a through-hole extending through the entire stack (for instance a fully cured core). In order to temporarily fix the component in such a cavity, a sticky tape (with or without holes) may be attached to a lower main surface of the stack so as to partially or even entirely close the cavity. After that, the component may be attached to the temporary carrier.

In an embodiment, the method comprises at least partially filling a gap in the cavity between the component and the stack with an additional filling medium, and thereafter removing the temporary carrier from the stack, the component and the filling medium. Such a filling medium may be a material which fixes the component in place within the cavity. After having applied and cured such a filling medium, the layer stack becomes stiffened and the temporary carrier is no longer needed for defining the position of the component in the cavity and can be removed. For instance, a sticky tape (as example for the temporary carrier) may be delaminated or peeled off from the rest of the component carrier being presently manufactured.

In an embodiment, filling the gap is carried out by at least one of the group consisting of applying a liquid filling medium into the gap, and laminating an at least partially uncured electrically insulating layer structure to the stack and the component. Hence, the filling medium may for instance be liquid medium applied by a dispensing device or the like after having placed the component on the temporary carrier. For instance, such an adhesive may be an epoxy-based adhesive. Alternatively, a previously at least partially uncured electrically insulating layer structure (for instance a prepreg layer) may be laminated on both the stack and the component. During this lamination process, i.e. the application of heat and/or pressure, dielectric material of the previously at least partially uncured electrically insulating layer structure may melt or may become liquid and may also flow in the gap between component and stack. During this lamination, the previously at least partially uncured electrically insulating layer structure may be cured by cross-linking of a resin material thereof. After that, the cross-linked and cured material will re-solidify and may then fix the component in place in the cavity of the stack. It is also possible that the dielectric layer itself is made of an at least partially uncured material which may be cured during lamination so as to flow in the gaps and fill them while contributing to an adhesion between the constituents of the component carrier.

In an embodiment, the method comprises embedding by placing the component between a flat support structure (in particular at least one of the layer structures of the stack or a temporary carrier) and at least one flat one of the layer structures. In such an embodiment, no cavity needs to be formed before embedding the component in the stack. In contrast to this, the present embodiment uses planar layer structures between which the component is embedded by lamination without the prior formation of a through-hole or a blind hole. No core, i.e. already fully cured material, needs to be used in such an embodiment which may correspond to a coreless configuration.

Still referring to the previously described embodiment, the embedding may comprise pressing the component into the at least one of the layer structures and/or into the support structure. Pressing the component into planar electrically insulating layer structures (for instance prepreg layers) above and/or below the component during lamination may become possible when the mentioned electrically insulating layer structures are not yet fully cured at the point of time of pressing the component into such layers. By the described embodiment in which the component is embedded by pressing it between two flat structures, formation of a cavity in terms of embedding becomes dispensable.

In an embodiment, the at least one dielectric layer is in a fully cured state already prior to inserting the component in the stack. When the dielectric layer is already cured (for instance is FR4 material) at the point of time of embedding, it can be safely ensured that the dielectric layer stays in place and does not flow into gaps in a surrounding during the manufacturing process. This ensures a high spatial accuracy of the position of the component within the stack.

In another embodiment, the at least one dielectric layer is in an at least partially uncured state when inserting the component in the stack. In such an alternative embodiment, the material of the dielectric layer may be cured by lamination, i.e. the application of heat and/or pressure, and may therefore contribute to the interior or intrinsic adhesion between the constituents of the component carrier. In such an embodiment, the pad(s) of the component may still be completely covered by the dielectric material when embedding the component into the stack.

In an embodiment, the method comprises inserting the component in the stack in a condition in which the at least one dielectric layer is a continuous layer. The one or more openings extending through the dielectric layer and up to the pads may then be formed later, i.e. after the embedding procedure.

Still referring to the previously described embodiment, the method comprises forming the at least one opening and the at least one electrically conductive contact after the inserting. This allows the dielectric layer to properly protect the contact surface of the component during the embedding procedure and to expose the contact surface only after the embedding.

In an embodiment, at least partially filling the at least one opening with the at least one electrically conductive contact element comprises attaching a further electrically conductive layer structure (such as a copper foil) to a bottom of the stack and to at least one of the at least one dielectric layer, and at least partially plating (for instance galvanically plating) the at least one opening with electrically conductive material.

In an embodiment, the method comprises providing the dielectric layer with an electrically insulating matrix (in particular a polymer removable by a laser beam) and an additive comprising a metal compound (in particular a metal compound being activatable by a laser beam), selectively treating a surface portion of the dielectric layer (in particular by irradiation with a laser beam along a predefined trajectory) to thereby locally remove material of the electrically insulating matrix while simultaneously locally activating the additive for promoting subsequent metal deposition, and selectively depositing metallic material on the locally activated additive. Descriptively speaking, the dielectric layer on the component may be treated by a laser beam in such a way that only in the regions of the laser treatment, a surface of the dielectric layer becomes laser activated. A subsequent deposition of metallic material (in particular copper) predominantly or even fully selectively occurs on the laser activated additive only, since the metallic compounds form seeds for such a metallization. For instance, such a metallization may be carried out in a current-less way (for instance in a copper bath or the like). When the additive of the metallic compound is electrically insulating, the manufactured metallization may form electrically conductive traces on the component carrier.

In an embodiment, the method comprises connecting at least one further electrically insulating layer structure and/or at least one further electrically conductive layer structure to at least one of a top side and a bottom side of the stack. Thus, a further build-up may be carried out after the embedding procedure in accordance with a desired application of the component carrier being manufactured. The mentioned connection of at least one further layer structure to one or both of the two opposing main surfaces of the stack with embedded component may be carried out symmetrically or asymmetrically.

The material of the dielectric layer may also be functionalized. In other words, the material may be selected so that the dielectric layer fulfils at least one additional function. As an example, such a function may be a high frequency capability, a heat removal property, etc.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, a light guide, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite base structure) or may be a paramagnetic element. How-ever, the component may also be a further component carrier, for example in a board-in-board configuration. One or more components may be surface mounted on the component carrier and/or may be embedded in an interior thereof. Moreover, also other than the mentioned components may be used as component.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

In an embodiment, the at least one electrically insulating layer structure comprises at least one of the group consisting of resin (such as rein-forced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

In an embodiment, the component carrier is a laminate-type body. In such an embodiment, the semifinished product or the component carrier is a compound of multiple layer structures which are stacked and connected together by applying a pressing force, if desired accompanied by heat.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

Figure 1:
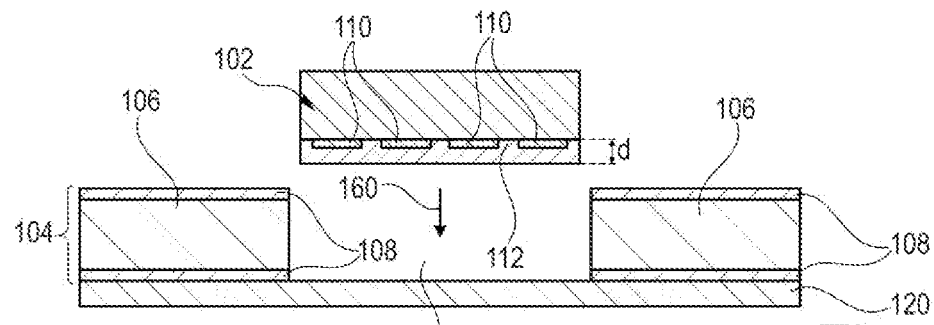
FIG. 1, FIG. 2, FIG. 3, and FIG. 4 illustrate cross-sectional views of structures obtained during carrying out a method of manufacturing a component carrier with an embedded component, shown in FIG. 5, according to an exemplary embodiment of the invention.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, an embedding architecture using dielectrically coated or covered components is provided.

By using a component having a dielectric layer at the point of time of embedding this component in a component carrier stack, laminating procedures may be omitted in a build-up based on a temporary carrier. This may allow obtaining simply manufacturable and thin component carriers.

In one embodiment, the following method of manufacturing a component carrier may be carried out.

First, a stack comprising at least one electrically insulating layer structure and/or at least one electrically conductive layer structure (for instance a core) which has been provided with cavities in the form of through-holes or the like may be laminated with a temporary carrier. Thereafter, the components with the dielectric layer may be placed in these through-holes and on the temporary carrier, in particular with the dielectric layer being connected directly with the temporary carrier. The components may be adhered with the stack by an appropriate adhesive or resin filled in gaps between the stack and the component carrier. Thereafter, the temporary carrier may be removed. The surface may be metallized, for instance by carrying out a metal deposition procedure (for instance a chemical copper deposition procedure followed by a galvanic copper deposition procedure). Additionally or alternatively, it is possible to laminate, for instance using prepreg foils, copper foils and/or RCC (Resin Coated Copper) foils. Thereafter, a patterning, contacting and further component carrier manufacturing procedure may be carried out.

In another embodiment, the following method may be carried out: A stack composed of at least one electrically insulating layer structure and/or at least one electrically conductive layer structure (such as a fully cured core) may be laminated on a temporary carrier after having forming through-holes or the like extending through the stack as cavities. The components with the dielectric layers may be placed with the dielectric layer facing the temporary carrier on the bottom. A lamination with at least one further layer structure (for instance a prepreg sheet, a resin sheet with a copper foil or an RCC foil) may be performed. Thereafter, the temporary carrier may be removed. For instance, an uppermost copper layer may be removed, for example by etching. Thereafter, a main surface may be metallized using a metal deposition procedure (for instance a chemical copper deposition procedure followed by a galvanic copper deposition procedure). After that, patterning, contact formation and continuation of the component carrier manufacturing procedure may be carried out.

It should be mentioned that by providing the component with a dielectric layer on one main surface of two opposing main surfaces of the component, pads of the component may be contacted directly after embedding, without the need to carry out an additional dielectric lamination procedure beforehand. This allows obtaining particularly thin component carriers. In an embodiment, a specific coating (for instance using a palladium complex) may be used, and the stack (for instance a core) may be roughened before metallization (for instance by a plasma process).

The above-described embodiments refer to an embedding of the component with dielectric layer using cavities formed in a stack. However, other exemplary embodiments of the invention may embed the component with dielectric layer without the use of cavities. In such embodiments, it is possible to use in particular one or more of the following materials: Resin sheets, asymmetric prepregs, RCC (Resin Coated Copper) materials, Sumitomo materials, TD002 prepreg, coatings (i.e. liquid resin compounds), mold materials (for instance on the basis of resin mixtures), etc. In an embedding procedure without cavities in a stack, the components with the one or more dielectric layers may be pressed into adjacent material (for instance of planar layers) during lamination. For contacting the embedded components, it is for instance possible to form copper-filled laser vias, copper-filled plasma vias and/or copper pillars.

In yet another exemplary embodiment, it is possible to embed pre-patterned components. In such an embodiment, components having a dielectric layer may be embedded after patterning of the dielectric layer. For instance, such a patterning can be performed by a photo or plasma process forming one or more openings in the dielectric layers for exposing the pad(s) of the component. Contacting may be carried out by laser drilling with a subsequent copper filling procedure.

In still another exemplary embodiment of the invention, it is possible to embed components using photovias. In such an embodiment, it is for instance possible to employ a photo-imagable dielectric layer (for instance made of a photoresist) in which the vias exposing the pads of the component can be formed by imaging and stripping. Filling the vias may be carried out during a subsequent copper procedure.

In yet another exemplary embodiment of the invention, embedding of components may be accomplished using plasma vias. The vias for exposing the pads of the component may be formed by applying a mask followed by a plasma etching procedure. Filling the vias may be carried out during a copper process.

In still another exemplary embodiment of the invention, embedding of components may be accomplished using copper pillars extending through openings of the dielectric layer. Vias for contacting the pads of a component may be realized by forming a dielectric layer on the component which is already provided with copper pillars.

In yet another exemplary embodiment of the invention, embedding of components may be accomplished using a laser patternable dielectric layer. For such an embodiment, the components may be provided with a polymeric dielectric layer which is doped with a (preferably electrically non-conductive) laser activatable metal compound as additive to the polymer. At a position where a laser beam impinges on such a plastic, the plastic matrix can be disintegrated into volatile reaction products in a surface region. At the same time, metal seats may be split off from the additives which are present in a micro-rough surface. These metal particles form a seed for a subsequent metallization. In a current-less copper bath, the partial surfaces treated by the laser processing may be used for forming electrically conductive traces. A corresponding patterning procedure may be embodied as Laser Direct Patterning process.

In still another exemplary embodiment of the invention, a thermally conductive coating may be used as material for the dielectric layer. When the dielectric layer is equipped with or made of thermally highly conductive particles such as AlN, $Al_2O_3$, BN, the heat removal properties of the components may be improved.

In an embodiment, it is possible to form the dielectric layer covering at least a part of a surface of the component using a material in a B-stage configuration. In other words, the dielectric material of the dielectric layer may still be in an at least partially uncured state, for instance may be provided as a not yet fully cross-linked epoxy resin. The dielectric layer may then contribute to the intra-stack adhesion of the component carrier being manufactured.

Figure 3:
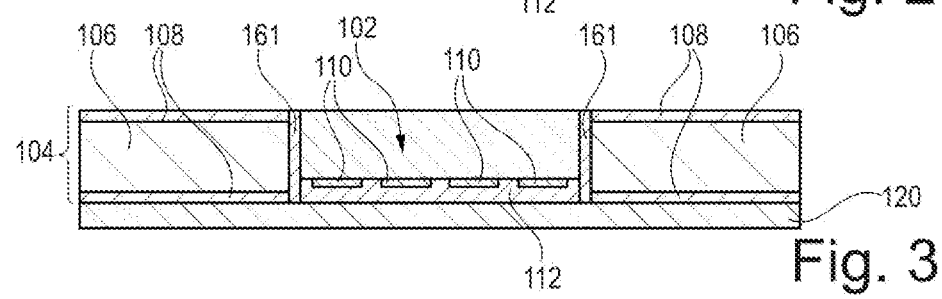
Figure 4:
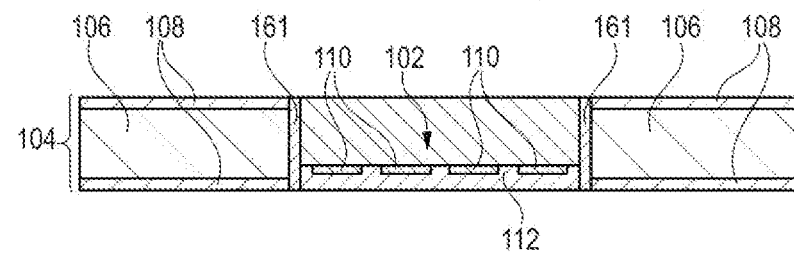
Figure 5:
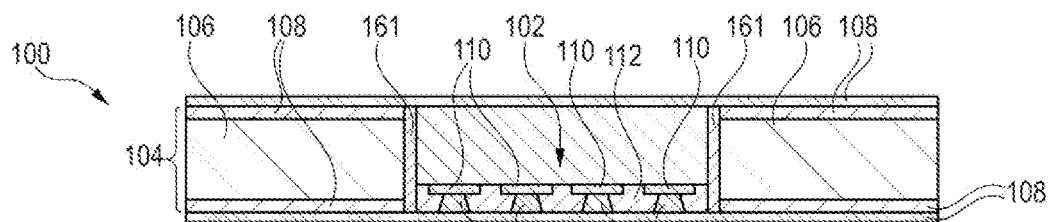

FIG. 1 to FIG. 5 illustrate cross-sectional views of structures obtained during carrying out a method of manufacturing a component carrier 100 with an embedded component 102, shown in FIG. 5, according to an exemplary embodiment of the invention.

Referring to FIG. 1, a stack 104 composed of electrically conductive layer structures 108 and an electrically insulating layer structure 106 is shown. In the shown embodiment, the stack 104 may be a core of fully cured resin (optionally comprising reinforcing particles such as glass fibers) constituting the electrically insulating layer structure 106 which is covered on both opposing main surfaces with a respective copper foil constituting a respective one of the electrically conductive layer structures 108. As can be taken from FIG. 1, a cavity 118 is formed as a through hole in the stack 104.

Furthermore, a component 102 (such as a semiconductor chip) is shown which is to be embedded in the cavity 118 formed in the stack 104. The component 102 comprises a dielectric layer 112 covering only the entire lower main surface of the component 102. For example, a thickness "d" of the dielectric layer 112 may be 10 µm. The dielectric layer 112 extends over the entire main surface but does not extend beyond the main surface in a lateral direction corresponding to a horizontal direction according to FIG. 1. The dielectric layer 112 therefore also covers pads 110 formed on a lower main surface of the component 102. The dielectric layer 112 may be in a fully cured state already prior to inserting the component 102 in the stack 104. For instance, the dielectric layer 112 may be made of a fully cured resin (such as an epoxy resin), optionally comprising reinforcing particles such as glass fibers. In such an embodiment, the material of the dielectric layer 112 is prevented from flowing away during a lamination procedure which ensures that the component 102 remains precisely in place during lamination. Alternatively, the dielectric layer 112 may be in an at least partially uncured state when inserting the component 102 in the stack 104. In such an embodiment, the material of the dielectric layer 112 may contribute to the adhesion of the constituents of the component carrier 100.

Moreover, a temporary carrier 120 (here embodied as a sticky tape) is shown which has been attached to a lower main surface of the stack 104 so as to close the entire bottom of the cavity 118.

As can be taken from an arrow 160 in FIG. 1, the component 102 with the dielectric layer 112 on its bottom surface is to be placed in the cavity 118.

Figure 2:
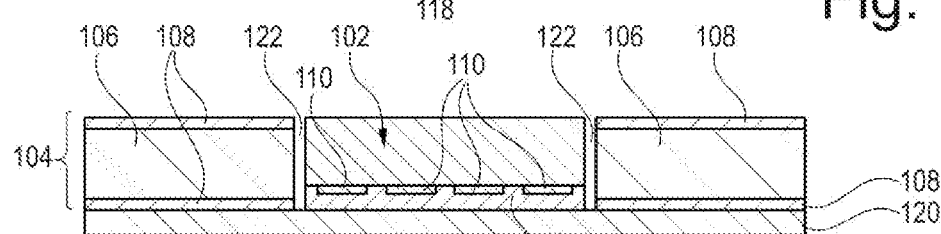

Referring to FIG. 2, the component 102 is now placed in the cavity 118 so that the dielectric layer 112 is attached onto the temporary carrier 120. The component 102 is hence accommodated in the stack 104 in a condition in which the dielectric layer 112 is a continuous layer arranged exclusively but completely on exactly one main surface of the component 102. As a result, the dielectric layer is attached to a sticky surface of the temporary carrier 120, for instance a sticky tape. As can be taken from FIG. 2, a bottom surface of the dielectric layer 112 is at the same vertical level and in alignment with a bottom surface of the stack 104.

Referring to FIG. 3, a gap 122 in the cavity 118 between the component 102 and the stack 104 is filled with an additional filling medium 161. This procedure of filling the gap 122 may be carried out by applying a liquid filling medium into the gap 122 and by curing the liquid filling medium. The gaps 122 are thus filled with adhesive material which is cured for fixing the component 102 in place in the cavity 118.

Referring to FIG. 4, the temporary carrier 120 is then removed from the stack 104, the embedded component 102 and the cured filling medium 161. The adhesive tape forming the temporary carrier 120 is hence removed by peeling it off.

Referring to FIG. 5, openings 116 (not shown in FIG. 5, compare however for instance FIG. 23) are formed in the dielectric layer 112, for instance by laser drilling. Subsequently, the openings 116 are filled with electrically conductive material to thereby form electrically conductive contacts 114 for electrically connecting the pads 110 of the component 102 with an electronic periphery of the component carrier 100 being presently formed. The openings 116 in the dielectric layer 112 are thus filled with electrically conductive material after embedding the component 102. Hence, the dielectric layer 112 is made of a copper-plateable and laser drillable material. Advantageously, the electrically conductive contacts 114 can be formed without previously connecting a further electrically insulating layer structure to the dielectric layer 112 and the stack 104.

As can be taken from FIG. 5 as well, it is possible to attach a respective further electrically conductive layer structure 108 (such as a further copper foil) to both a top and a bottom of the stack 104 and to the dielectric layer 112 and the component 102, respectively. Thereafter, the openings 116 may be plated with electrically conductive material such as copper. FIG. 5 shows the result of a metallization and contacting procedure and hence the component carrier 100.

Figure 6:
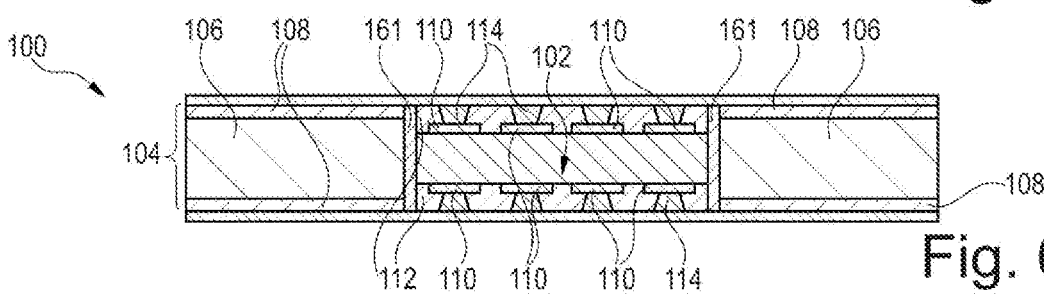
FIG. 6 illustrates a cross-sectional view of a component carrier according to another exemplary embodiment of the invention.

Referring to FIG. 6, a component carrier 100 according to another embodiment is shown in which the component 102 has pads 110 and a respective dielectric layer 112 on each of two opposing main surfaces of the component 102. Each respective dielectric layer 112 partially covers the respective pads 110 on the respective main surface of the component 102. FIG. 6 hence shows an alternative component carrier 100 which differs from the embodiment of FIG. 5 in that electrically conductive contacts 114 extending through openings 116 in the respective dielectric layer 112 are formed on both opposing main surfaces of the component 102.

Optionally and although not shown in FIG. 1 to FIG. 6, it is possible to laminate at least one further electrically insulating layer structure 106 (such as at least one prepreg layer) and/or at least one further electrically conductive layer structure 108 (such as at least one further copper foil) to the top side and/or the bottom side of the component carrier 100 shown in FIG. 6.

Figure 10:
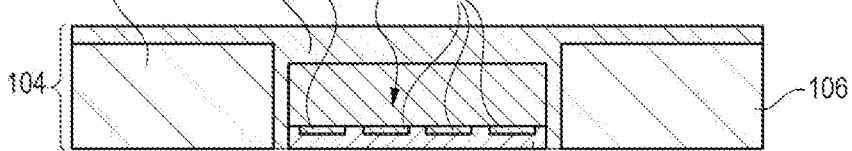
Figure 11:
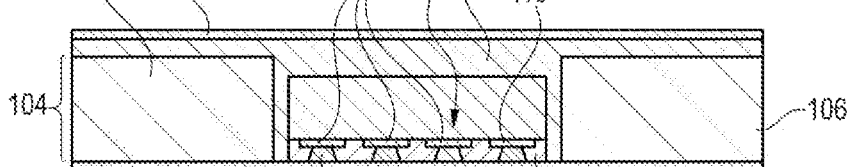
Figure 12:
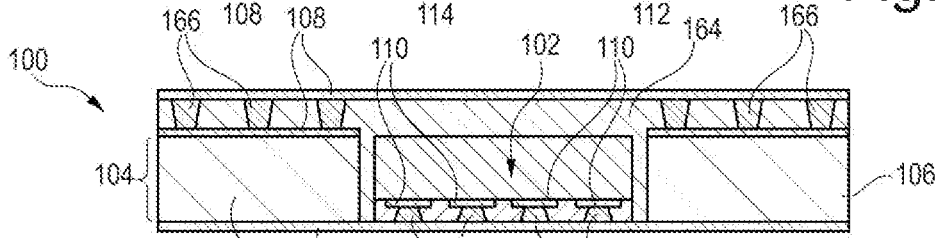

FIG. 7 to FIG. 12 illustrate cross-sectional views of structures obtained during carrying out a method of manufacturing a component carrier 100 with an embedded component 102, shown in FIG. 12, according to another exemplary embodiment of the invention.

Figure 7:
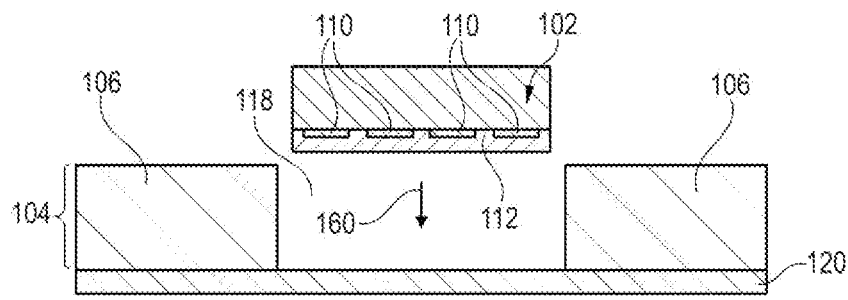
FIG. 7, FIG. 8, FIG. 9, FIG. 10 and FIG. 11 illustrate cross-sectional views of structures obtained during carrying out a method of manufacturing a component carrier with an embedded component, shown in FIG. 12, according to another exemplary embodiment of the invention.
Figure 8:
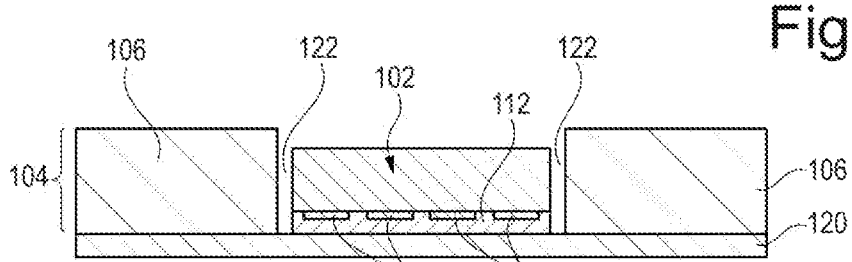

The procedure shown in FIG. 7 and FIG. 8 correspond to the procedures shown in FIG. 1 and FIG. 2, respectively.

Figure 9:
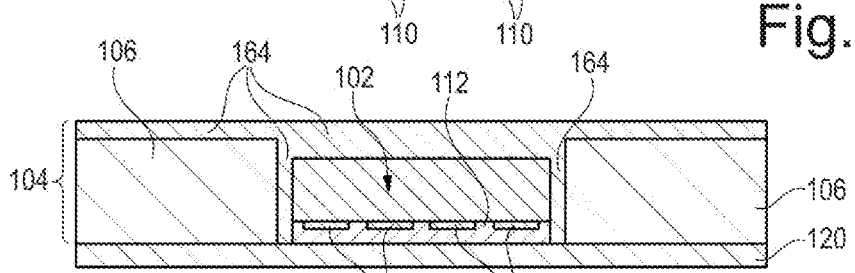

Referring to FIG. 9, a further electrically insulating layer structure 164 (such as a prepreg sheet) is laminated on the upper main surface of the structure shown in FIG. 9. Due to the curing of the resin material of the further electrically insulating layer structure 164 (by the application of pressure and/or heat) the material of the further electrically insulating layer structure 164 re-melts and becomes flowable so as to fill the gaps 122 until it re-solidifies after completion of a cross-linking process.

According to FIG. 10, temporary carrier 120 is now removed since the component 102 is now fixed in place due to the resin filling of the gaps 122 as a result of the lamination process described referring to FIG. 9.

The structure of FIG. 11 is then obtained by a metallization and contacting procedure.

The component carrier 100 according to FIG. 12 has electrically conductive contacts 166 formed in an upper portion of the component carrier 100. These electrically conductive contacts 166 are formed at laterally adjacent portions of the component 102, i.e. extending through the further electrically insulating layer structure 164 connected by the procedure described above referring to FIG. 9.

FIG. 13 to FIG. 19 illustrate cross-sectional views of structures obtained during carrying out a method of manufacturing component carriers 100 with embedded component 102 according to other exemplary embodiments of the invention. FIG. 13 to FIG. 19 show structures obtained during manufacturing a component carrier 100 by an embedding procedure using a copper covered core as stack 104. Fixing a component 102 in place may be accomplished by filling gaps 122 of a cavity 118 with liquid adhesive or by laminating a previously at least partially uncured electrically insulating layer structure.

Figure 13:
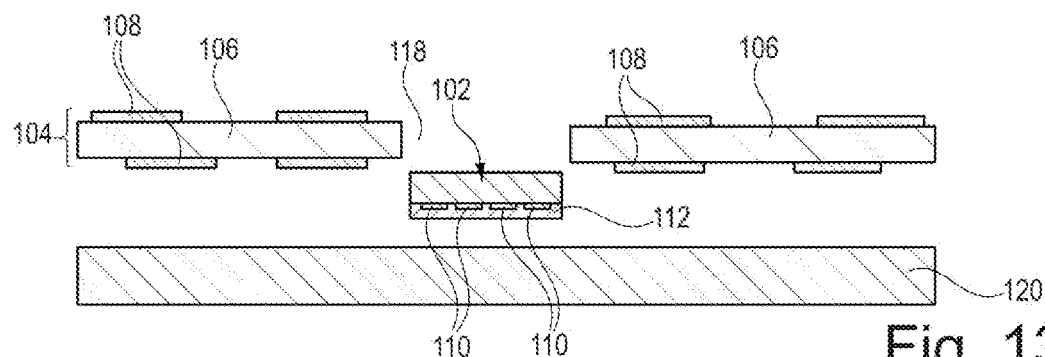
FIG. 13, FIG. 14, FIG. 15, FIG. 16, FIG. 17, FIG. 18 and FIG. 19 illustrate cross-sectional views of structures obtained during carrying out a method of manufacturing component carriers with embedded component according to exemplary embodiments of the invention.

According to FIG. 13, a stack 104 is shown which is configured as a core covered with patterned copper layers on both opposing surfaces thereof.

Figure 14:
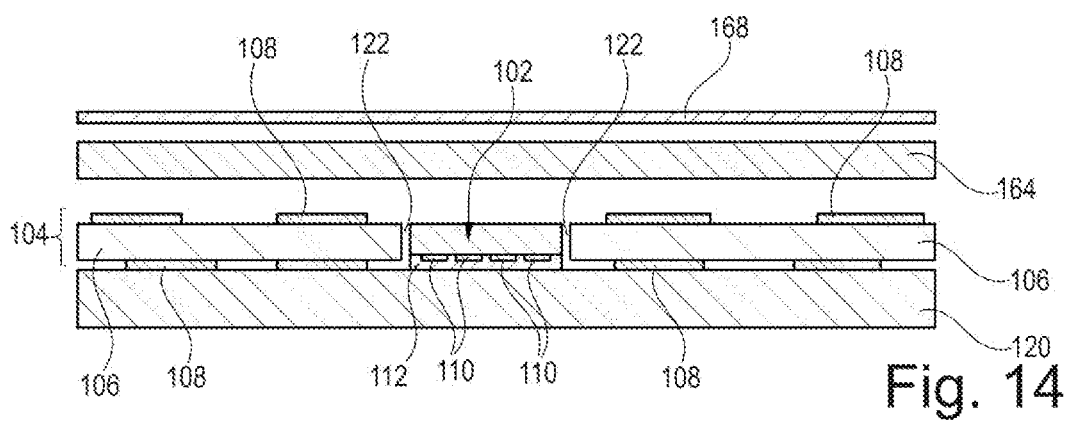

As can be taken from FIG. 14, the core with the cavity 118 is attached to temporary carrier 120. Component 102 with dielectric layer 112 on a lower main surface thereof is placed in the cavity 118 and is attached face down (i.e. with pads 110 oriented downwardly) to the sticky tape forming the temporary carrier 120. According to FIG. 14, the further build-up is accomplished by lamination of a further electrically insulating layer structure 164, such as a prepreg sheet, and a further electrically conductive layer structure 168, for instance a copper foil.

Figure 15:
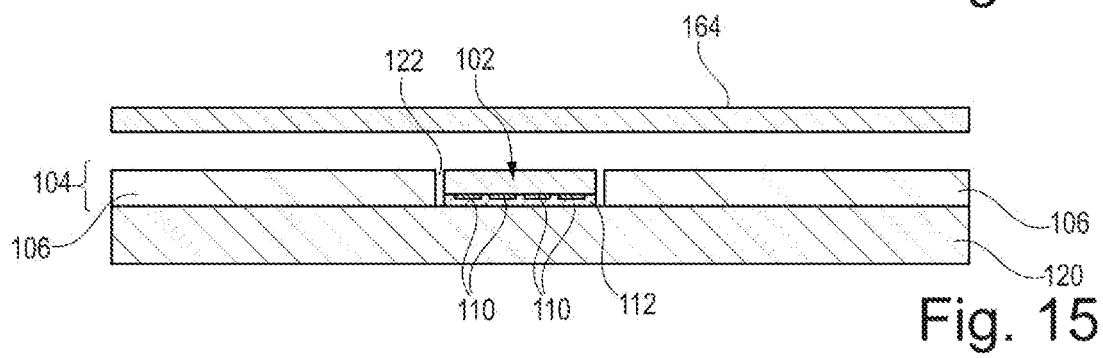

In contrast to this, the further build-up established according to FIG. 15 is carried out by lamination of only a resin or prepreg sheet as further electrically insulating layer structure 164.

Figure 16:
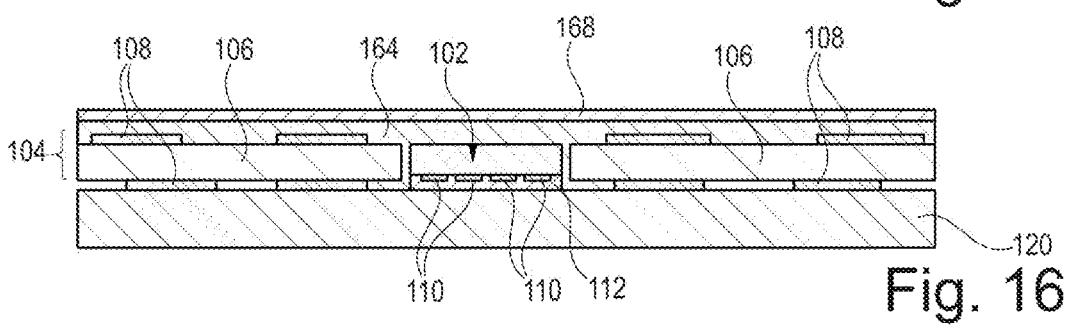
Figure 17:
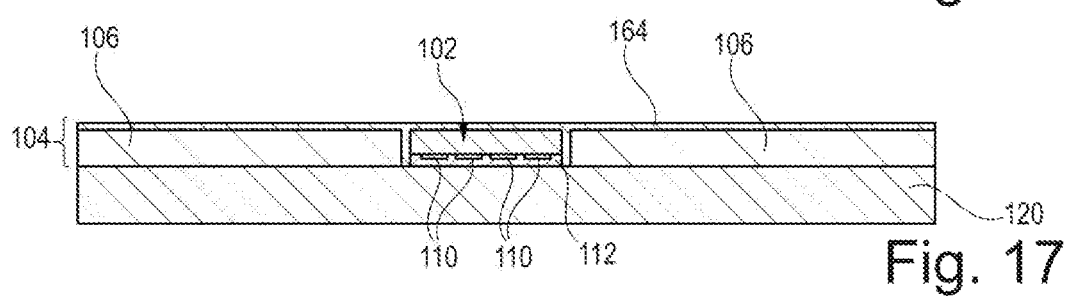

FIG. 16 shows the result of the lamination procedure according to FIG. 14, whereas FIG. 17 shows the result of the lamination procedure according to FIG. 15.

Figure 18:
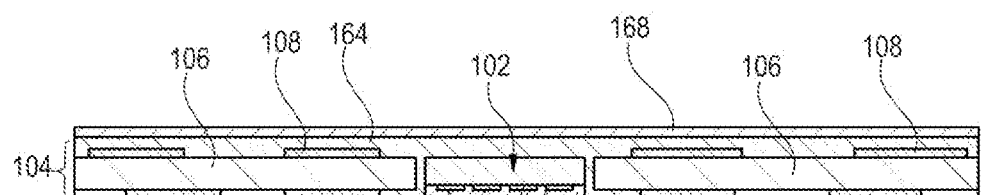

FIG. 18 shows a component carrier 100 (or a preform thereof) obtained by removing the temporary carrier 120 from the structure shown in FIG. 16.

Figure 19:
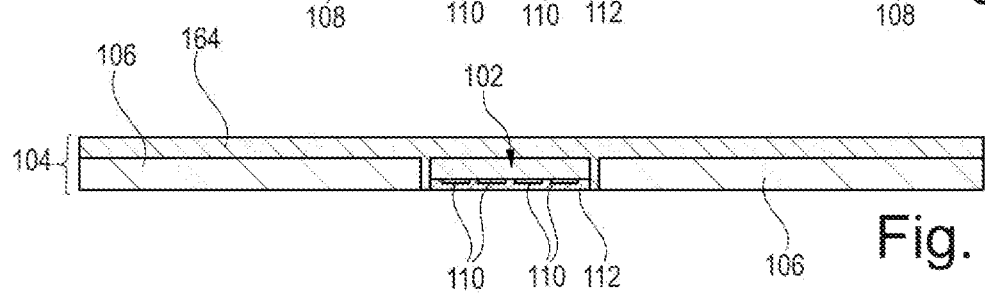

FIG. 19 shows a component carrier 100 (or a preform thereof) according to another exemplary embodiment of the invention obtained by removing the temporary carrier 120 from the structure shown in FIG. 17.

FIG. 20 to FIG. 24 illustrate cross-sectional views of structures obtained during carrying out a method of manufacturing a component carrier 100 with an embedded component 102 according to still another exemplary embodiment of the invention.

Figure 20:
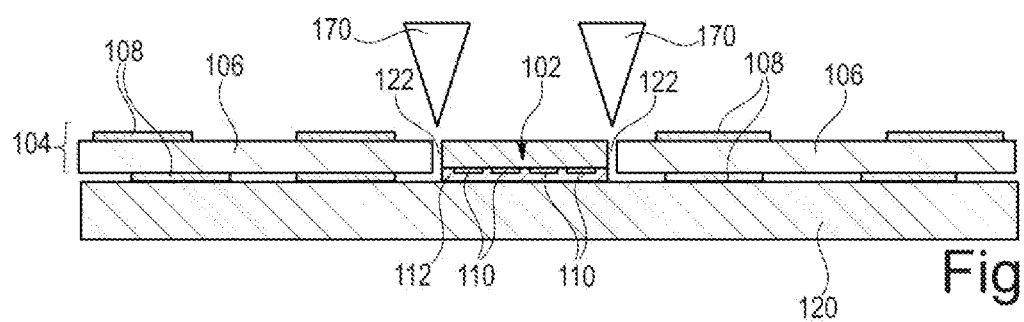
FIG. 20, FIG. 21, FIG. 22, FIG. 23 and FIG. 24 illustrate cross-sectional views of structures obtained during carrying out a method of manufacturing a component carrier with an embedded component according to another exemplary embodiment of the invention.

FIG. 20 shows, see reference numeral 170, how liquid adhesive 161 is applied in gaps 122 between the component 102 and the stack 104.

Figure 21:
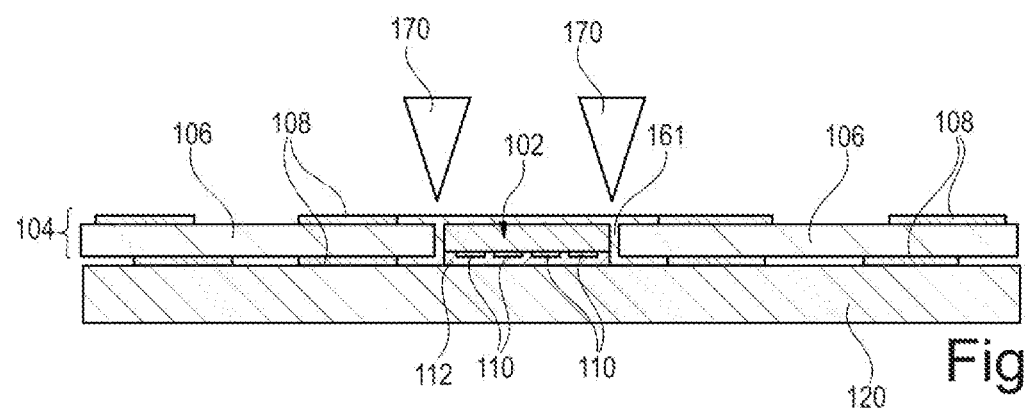

As can be taken from FIG. 21, such liquid adhesive 161 may be applied not only in the gaps 122, but also underfill voids at a lower side of the component 102 as well as covers the component 102 on an upper side.

Figure 22:
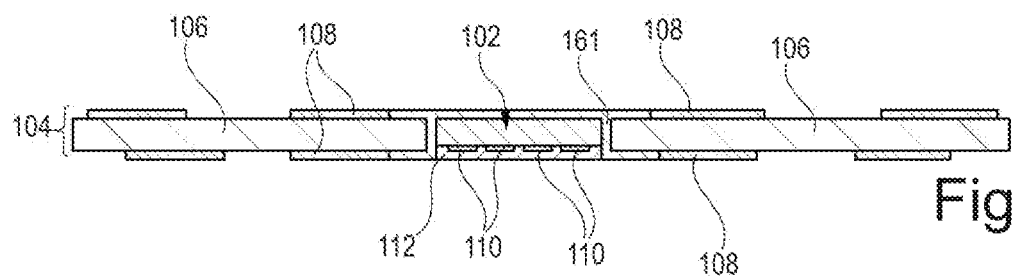

FIG. 22 shows the result of the application of the liquid adhesive 161 after curing. Furthermore, the temporary carrier 120 has meanwhile been removed from the lower main surface of the build-up shown in FIG. 21.

Figure 23:
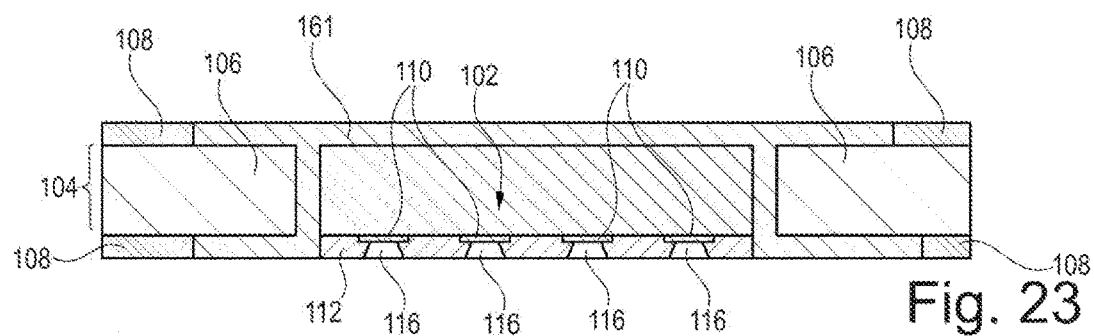

As can be taken from a detail shown in FIG. 23, laser vias have now been formed in the lower main surface of the shown layer structure, wherein these laser vias form frustoconical openings 116 extending from an exterior main surface of the shown structure up to the previously covered pads 110 of the component 102. By taking this measure, the pads 110 are partially exposed.

Figure 24:
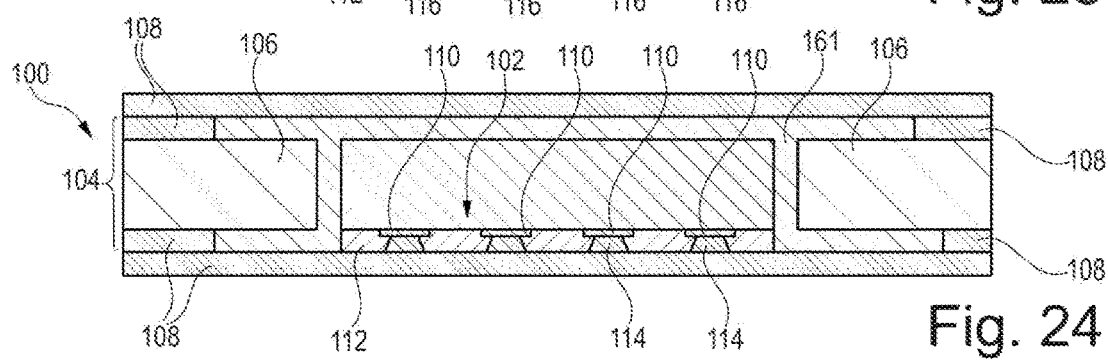

The component carrier 100 according to the detail illustrated in FIG. 24 can be obtained by filling the openings 116 with an electrically conductive material such as copper, thereby forming the electrically conductive contacts 114. This may be accomplished by a plating process.

FIG. 25 to FIG. 29 illustrate cross-sectional views of structures obtained during carrying out a method of manufacturing a component carrier 100 with an embedded component 102 according to another exemplary embodiment of the invention.

Figure 25:
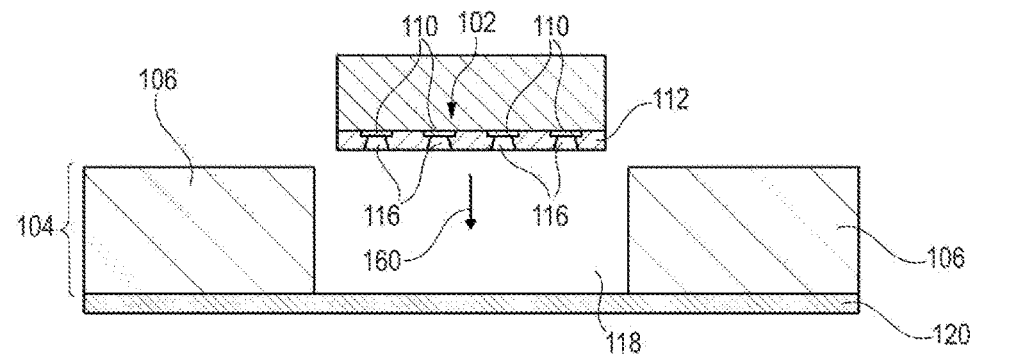
FIG. 25, FIG. 26, FIG. 27, FIG. 28 and FIG. 29 illustrate cross-sectional views of structures obtained during carrying out a method of manufacturing a component carrier with an embedded component according to still another exemplary embodiment of the invention.

Referring to FIG. 25, the component 102 is already provided with the openings 116 at the point of time of embedding the component 102. As shown in FIG. 25, the dielectric layer 112 of the component 102 is inserted in a cavity 118 of a stack 104 and is attached on a sticky surface of a temporary carrier 120 closing the cavity 118 on a bottom side. The dielectric layer 112 on the component 102 is already foreseen with through-holes or openings 116 extending up to the pads 110 of the component 102.

Figure 26:
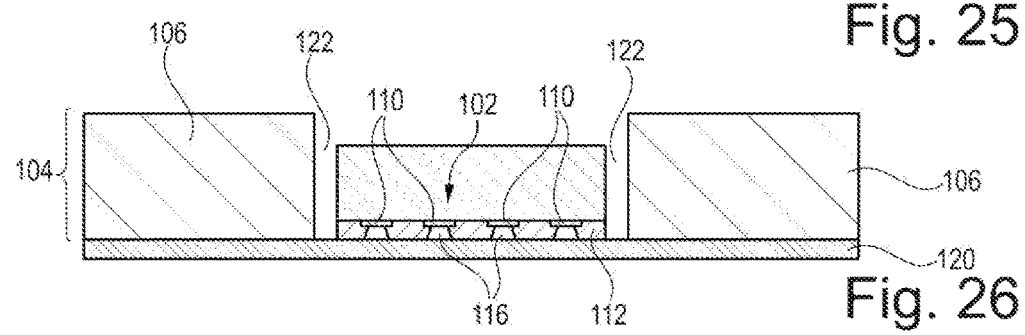

FIG. 26 shows the result of the described pick-and-place assembly.

Figure 27:
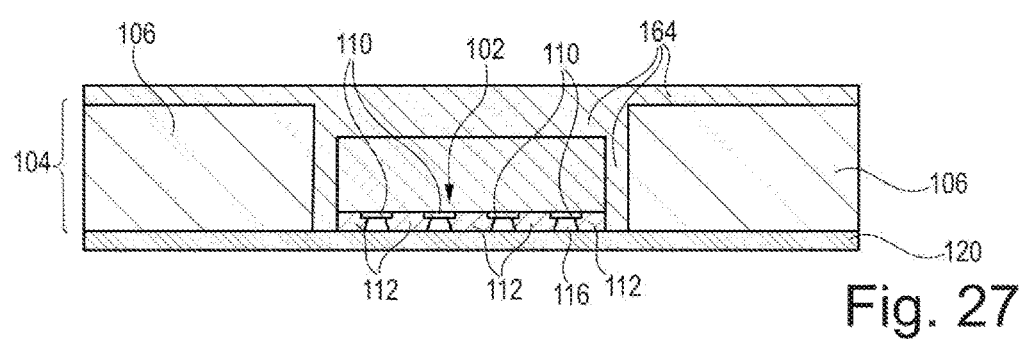

In order to obtain the structure shown in FIG. 27, a further electrically insulating layer structure 164 is laminated to an upper main surface of the structure shown in FIG. 26. Thereby, also the gaps 122 are filled with resin material or the like.

Figure 28:
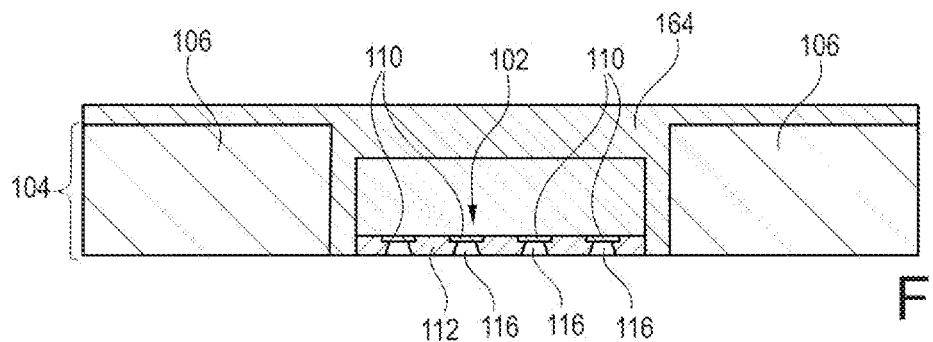

The structure shown in FIG. 28 may then be obtained by removing the temporary carrier 120. The pads 110 are thereby exposed towards the electronic environment, since the openings 116 are now exposed. The openings 116, which may be photovias, may therefore allow an access to the component 102 without the need of attaching a further electrically insulating layer structure to the lower main surface of FIG. 28.

Figure 29:
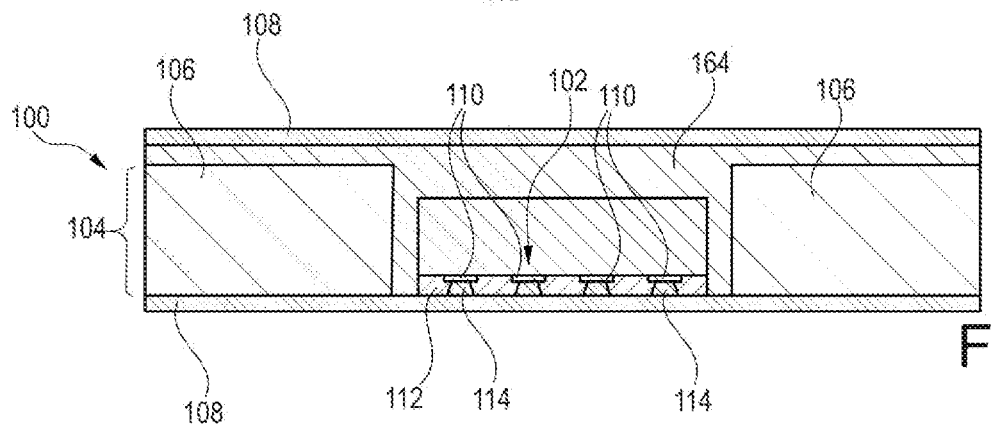

The component carrier 100 shown in FIG. 29 can be obtained by plating electrically conductive material such as copper on a lower main surface of the structure shown in FIG. 28. As a result, the openings 116 are filled with copper material or the like, thereby forming electrically conductive contacts 114. If desired, the electrically conductive layer structures 108 forming the upper and lower main surfaces, respectively, of the component carrier 100 according to FIG. 29 may be patterned.

FIG. 30 to FIG. 35 illustrate cross-sectional views of structures obtained during carrying out a method of manufacturing a component carrier 100 with an embedded component 102 according to an exemplary embodiment of the invention. Referring to FIG. 30 to FIG. 35, a method of manufacturing component carrier 100 according to yet another exemplary embodiment of the invention will be described in the following, which is based on the use of a component 102 which is not placed in a cavity 118 but which is sandwiched between two planar layers.

Figure 30:
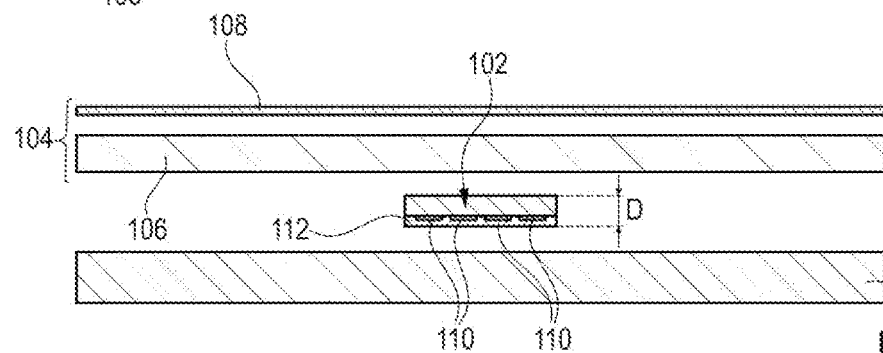
FIG. 30, FIG. 31, FIG. 32, FIG. 33, FIG. 34 and FIG. 35 illustrate cross-sectional views of structures obtained during carrying out a method of manufacturing a component carrier with an embedded component according to another exemplary embodiment of the invention.

Referring to FIG. 30, a bottom of the component 102 is placed on a flat main surface of temporary carrier 120. The component 102 is embedded between the layer structures 106, 108 on top and the temporary carrier 120 on bottom. More specifically, the embedding comprises pressing the component 102 into the layer structure 106 (which may be a resin or prepreg sheet). As shown in FIG. 30, the component 102 with the already applied dielectric layer 112 is hence placed between temporary carrier 120 on the lower side and electrically insulating layer structure 106 as well as electrically conductive layer structure 108 (such as a copper foil) on an upper side. The electrically insulating layer structure 106 may be an at least partially uncured layer structure, for instance a prepreg layer.

Figure 31:
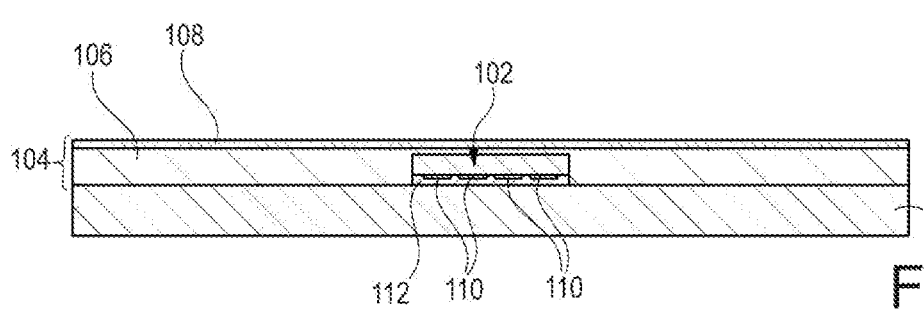

In order to obtain the layer structure shown in FIG. 31, the constituents according to FIG. 30 may be connected by lamination, in particular the application of pressure and/or heat. The integral body shown in FIG. 31 is thereby obtained. During this process, the component 102 with the dielectric layer 112 on the lower main surface thereof is pressed into the electrically insulating layer structure 106 and is thereby embedded.

Figure 32:
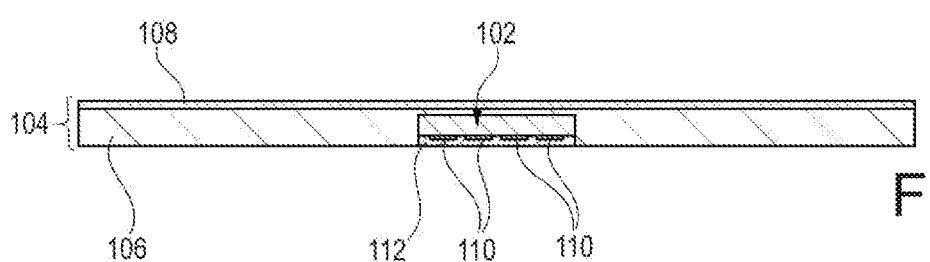

In order to obtain the structure shown in FIG. 32, the temporary carrier 120 may be removed from a lower main surface of the structure shown in FIG. 31.

Figure 33:
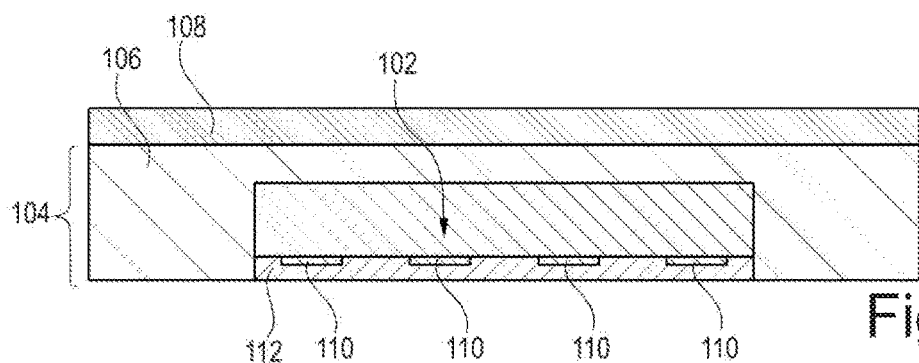

FIG. 33 shows a detail of the structure shown in FIG. 32.

Figure 34:
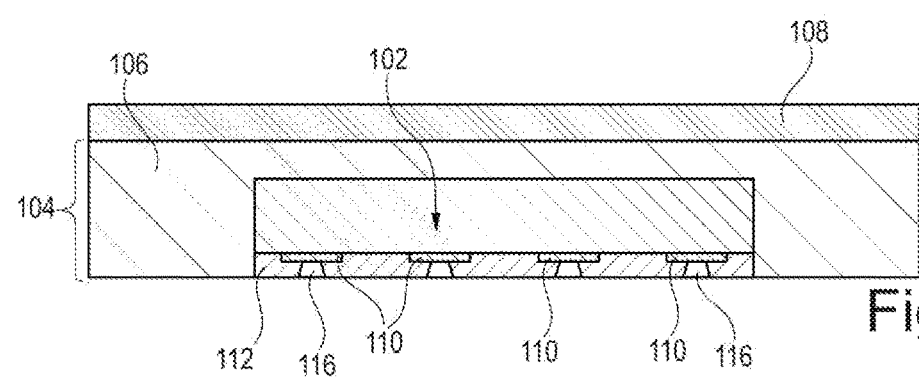

As can be taken from FIG. 34, the structure shown in FIG. 33 may then be made subject to a patterning procedure for forming the openings 116 extending through the dielectric layer 112 up to the pads 110, for instance by laser processing. By taking this measure, the pads 110 of the component 102 are exposed.

Figure 35:
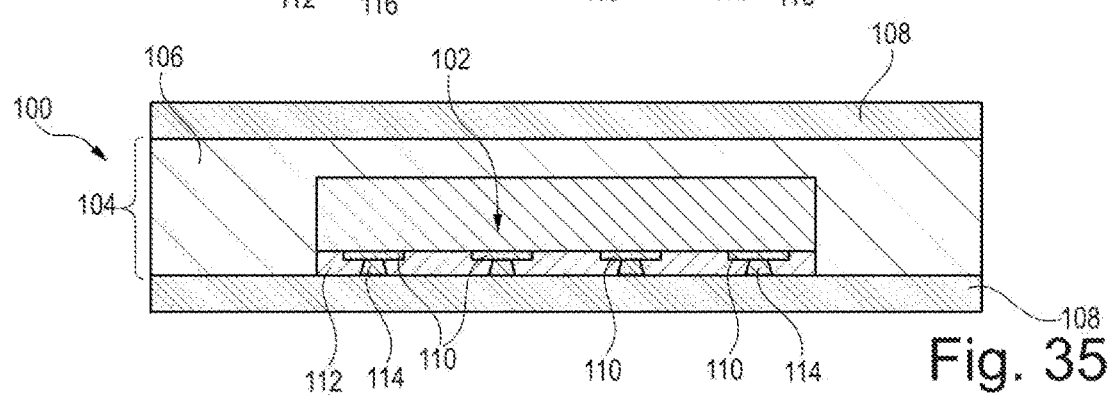

In order to obtain the component carrier 100 according to FIG. 35, the lower main surface of the structure shown in FIG. 34 is made subject to a metal deposition procedure. Thereby, the openings 116 are filled with metallic material, preferably copper, thereby forming electrically conductive contacts 114. By such a plating procedure, also the lower main surface of the stack 104 may be covered with electrically conductive material.

For the coreless processing according to FIG. 30 to FIG. 35, the component 102 may be provided with a vertical thickness "D" of preferably 10 μm to 50 μm, see FIG. 30.

FIG. 36 to FIG. 42 illustrate cross-sectional views of structures obtained during carrying out a method of manufacturing a component carrier 100 with an embedded component 102 according to another exemplary embodiment of the invention. Referring to FIG. 36 to FIG. 42, a method of manufacturing a component carrier 100 according to yet another exemplary embodiment of the invention will be described in which the components 102 with dielectric layer 112 are embedded without forming of a cavity 118. This manufacturing process may be carried out by implementing photovias.

Figure 36:
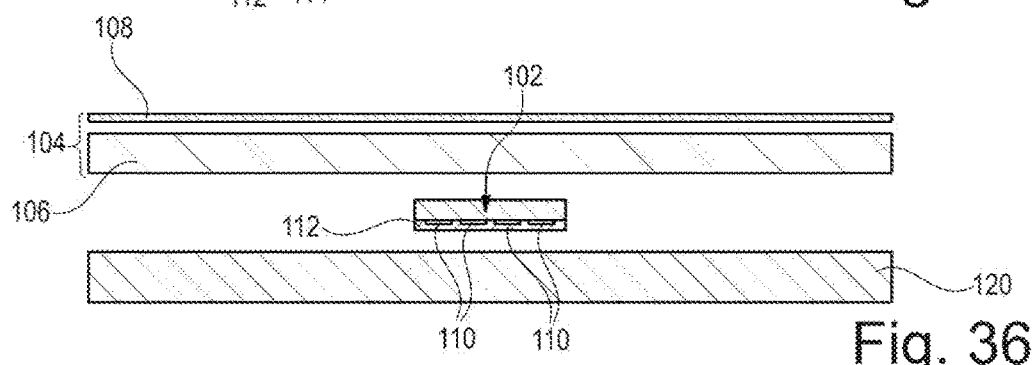
FIG. 36, FIG. 37, FIG. 38, FIG. 39, FIG. 40, FIG. 41 and FIG. 42 illustrate cross-sectional views of structures obtained during carrying out a method of manufacturing component carriers with embedded component according to other exemplary embodiments of the invention.
Figure 37:
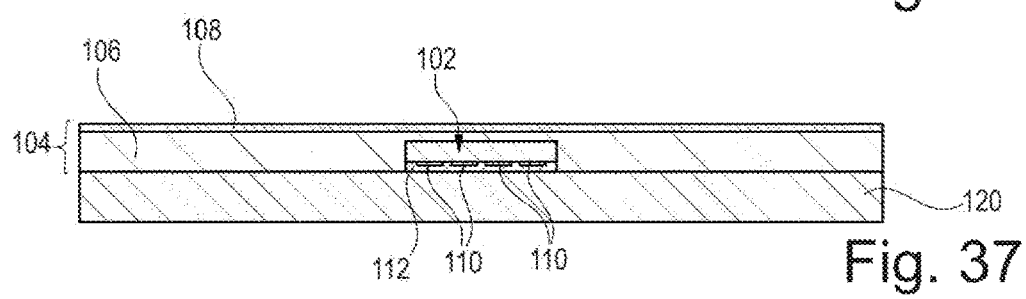
Figure 38:
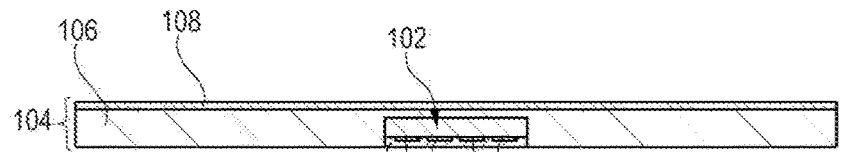

FIG. 36, FIG. 37 and FIG. 38 corresponds to the procedures described above referring to FIG. 30, FIG. 31, and FIG. 32, respectively.

Figure 39:
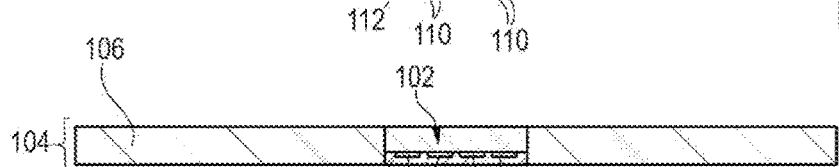

Removing material from the upper main surface of the structure shown in FIG. 38 allows obtaining the component carrier 100 as shown in FIG. 39.

Figure 40:
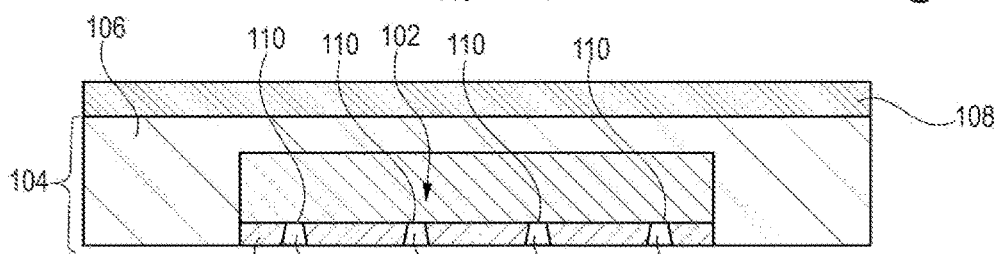

FIG. 40 shows a detailed view of a portion of the structure of FIG. 38.

Figure 41:
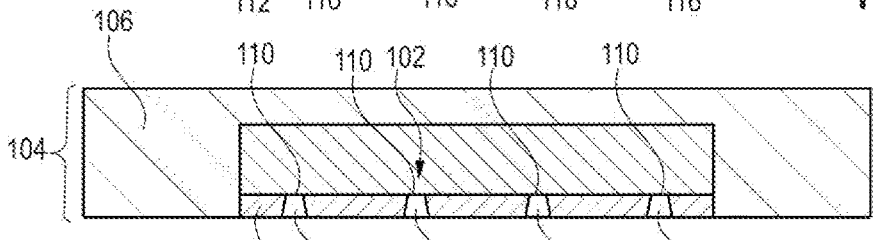

FIG. 41 shows a detail of the structure shown in FIG. 39.

Figure 42:
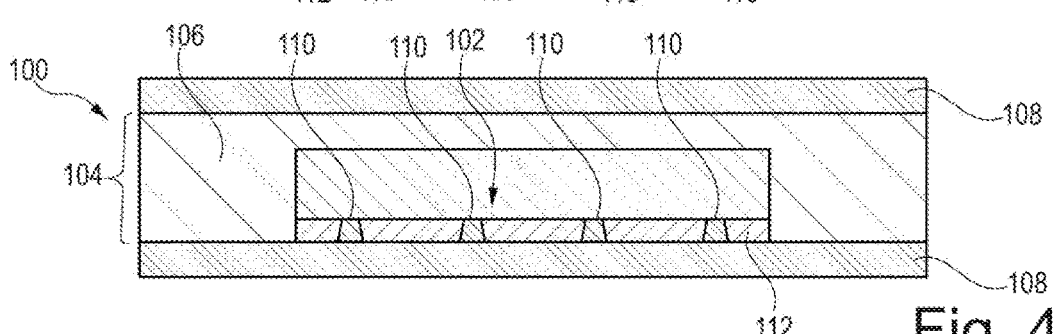

In order to obtain the component carrier 100 shown in FIG. 42, a (for instance copper) plating procedure can be carried out. The plated electrically conductive material fills the openings 116 to thereby form electrically conductive contacts 114. Also, the upper and the lower main surface of the component carrier 100 of FIG. 42 is covered with electrically conductive material such as copper as a result of the described plating procedure.

Figure 43:
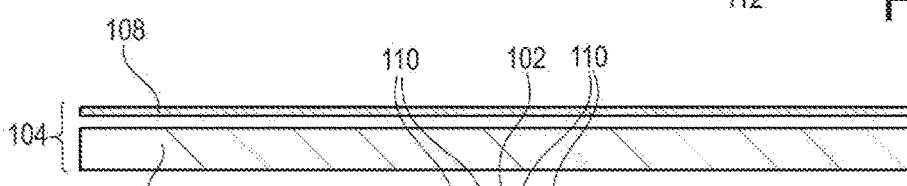
FIG. 43, FIG. 44 and FIG. 45 illustrate cross-sectional views of structures obtained during carrying out a method of manufacturing a component carrier with an embedded component according to yet another exemplary embodiment of the invention.
Figure 44:
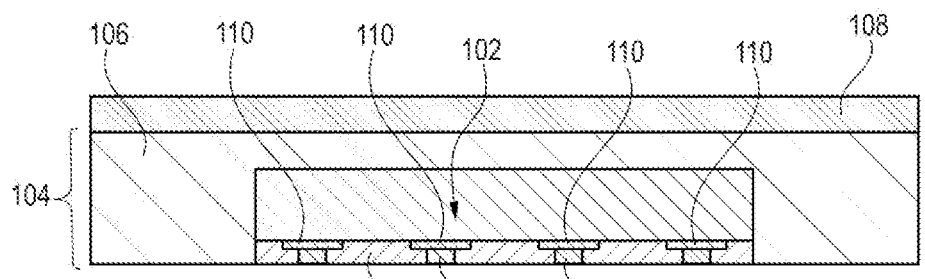
Figure 45:
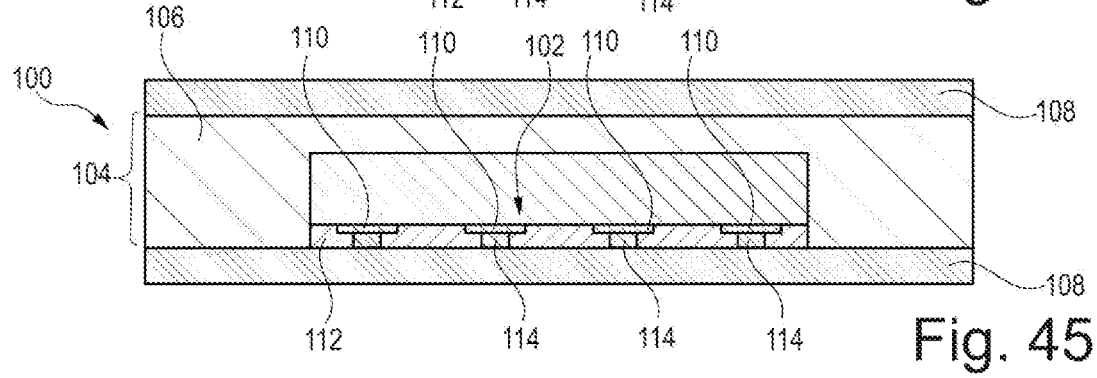

FIG. 43 to FIG. 45 illustrate cross-sectional views of structures obtained during carrying out a method of manufacturing a component carrier 100 with an embedded component 102 according to an exemplary embodiment of the invention. In this embodiment, copper pillars are used as electrically conductive contacts 114. From the beginning of the described process onwards, the component 102 with the dielectric layer 112 is already provided with the copper pillars as electrically conductive contacts 114 extending through the dielectric layer 112. In other words, the copper pillars already form part of the components 102 at the point of time before embedding the component 102 in stack 104.

Referring to FIG. 43, the described component 102 is placed between a temporary carrier 120 located on a bottom of the component 102 and an arrangement of layer structures 106, 108 located above the component 102. The layer structures 106, 108 are composed of an uncured electrically insulating layer structure 106 (for instance a prepreg layer) and an electrically conductive layer structure 108 (such as a copper foil).

The structure in FIG. 44 can be obtained by connecting the constituents shown in FIG. 43 by lamination followed by a removal of the temporary carrier 120.

FIG. 45 shows the result of a plating or a further lamination procedure applied to the structure of FIG. 44. As a result, both opposing main surfaces of the structure shown in FIG. 44 are covered by electrically conductive material such as copper. It is possible that the structure 100 according to FIG. 45 is further processed, for instance patterned.

Figure 46:
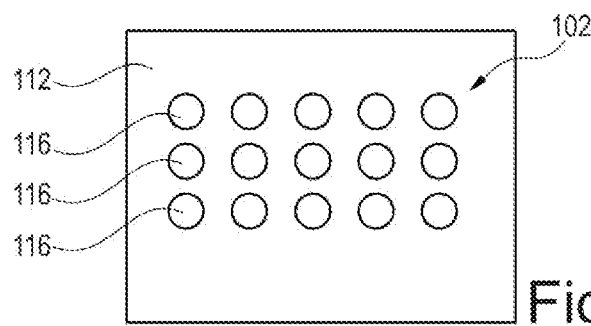
FIG. 46 and FIG. 47 illustrate plan views of structures obtained during carrying out a method of manufacturing a component carrier with an embedded component according to an exemplary embodiment of the invention.
Figure 47:
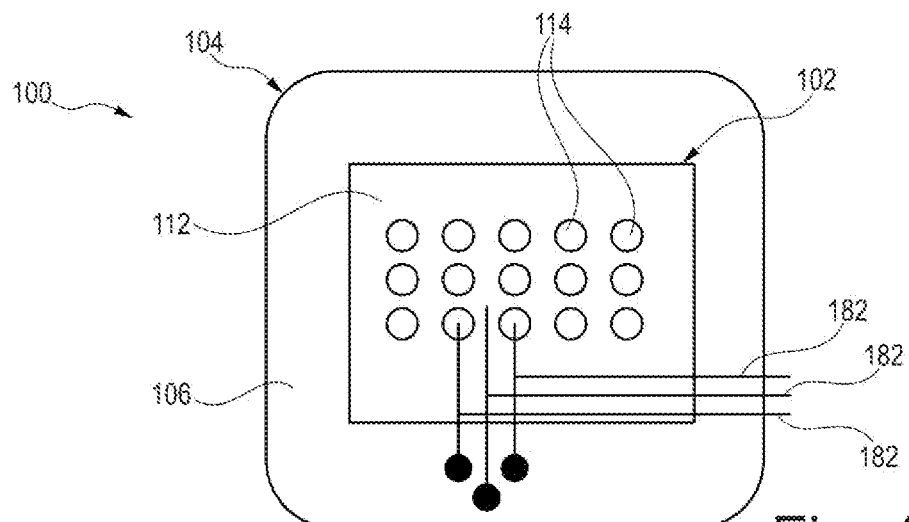

FIG. 46 and FIG. 47 illustrate plan views of structures obtained during carrying out a method of manufacturing a component carrier 100 with an embedded component 102 according to an exemplary embodiment of the invention.

FIG. 46 shows a plan view of a component 102 with a dielectric layer 112 and openings 116 for contacting pads 110 (not shown in FIG. 46). In the shown embodiment, the dielectric layer 112 is provided as a doped material with an electrically insulating matrix and an additive comprising a metal compound in the matrix. Such a component 102 may be used with both a coreless manufacturing process as well as with a manufacturing process using a core.

After an embedding procedure of the component 102 shown in FIG. 46 in a stack 104, and now referring to FIG. 47, a surface portion or trajectory of the dielectric layer 112 may be selectively processed by a laser beam (not shown) to thereby locally remove material of the electrically insulating matrix while simultaneously locally activating the additive for promoting subsequent metal deposition. By this activation, it becomes possible to subsequently selectively deposit metallic material (such as copper) on the locally activated additive only. As a result, electrically conductive traces 182 may be formed for establishing a desired electric contact task. In the shown embodiment, the electrically conductive traces 182 are also electrically coupled with the electrically conductive contacts 114 in the previous openings 116 for establishing an electric contact with the pads 110.

It is also shown in FIG. 47 that also an electrically insulating layer structure 106 of the stack 104 may be provided as a doped material with an electrically insulating matrix and an additive comprising a metal compound in the matrix. By taking this measure, the electrically conductive traces 182 may be formed partially on the dielectric layer 112, and partially on the electrically insulating layer structure 106.

In contrast to conventional approaches in which an electrically insulating layer structure on a bottom surface of a component is applied by lamination after embedding, an exemplary embodiment of the invention employs a component with dielectric layer applied to the component already at a point of time of the embedding. This allows manufacturing very thin laminate type component carriers with embedded components. The manufacturing process is significantly simplified. Such a manufacturing architecture may be used for all kind of component carriers, in particular of PCB type, with embedded components in which a very thin component carrier and a simple manufacturing procedure are desired.

In an example embodiment, a component carrier includes a stack, at least one dielectric layer and a component. The stack has at least one electrically insulating layer structure and/or at least one electrically conductive layer structure. The component has one or more pads. The at least one dielectric layer is arranged on at least one main surface of the component, such that the at least one dielectric layer does not extend beyond the main surface in a lateral direction, the at least one dielectric layer at least partially covers the one or more pads of the component and where at least one electrically conductive contact extends through at least one opening in the dielectric layer up to at least one of the one or more pads.

The component carrier as described in the preceding paragraph is arranged with at least one of the following features: i) a bottom surface of the dielectric layer is at the same vertical level and in alignment with a bottom surface of the stack; ii) the dielectric layer comprises at least one of the group consisting of resin, in particular epoxy resin, a photo-imagable dielectric, and polyimide; iii) the dielectric layer is made of a copper-plateable material; iv) the dielectric layer is made of a thermally conductive material, in particular having a value of the thermal conductivity of at least 1 W/mK; v) the dielectric layer is made of a laser drillable material; vi) a thickness of the dielectric layer is in a range between 0.5 μm and 100 μm, in particular in a range between 10 μm and 20 μm; vii) the at least one electrically conductive contact comprises at least one of the group consisting of a via, in particular at least one of a laser via, a photo via and a plasma via, filled at least partially with electrically conductive material, and a metallic pillar, in particular a copper pillar; viii) the component has one or more pads under a respective dielectric layer on each of two opposing main surfaces of the component; ix) each respective dielectric layer at least partially covers the respective one or more pads on the respective main surface of the component.

The An embodiment of a component carrier includes a stack, at least one dielectric layer and a component. The stack has at least one electrically insulating layer structure and/or at least one electrically conductive layer structure. The component has one or more pads. The at least one dielectric layer is arranged on at least one main surface of the component, such that the at least one dielectric layer does not extend beyond the main surface in a lateral direction, the at least one dielectric layer at least partially covers the one or more pads of the component and where at least one electrically conductive contact extends through at least one opening in the dielectric layer up to at least one of the one or more pads. The component carrier is arranged with at least one of the following features: i) the at least one electrically conductive layer structure comprises at least one of the group consisting of copper, aluminum, nickel, silver, gold, palladium, and tungsten, any of the mentioned materials being optionally coated with supra-conductive material such as graphene; ii) the at least one electrically insulating layer structure comprises at least one of the group consisting of resin, in particular reinforced or non-reinforced resin, for instance epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide; iii) the component is selected from a group consisting of an electronic component, an electrically non-conductive and/or electrically conductive inlay, a heat transfer unit, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a light guiding element, a further component carrier and a logic chip; iv) the component carrier is shaped as a plate; v) the component carrier is configured as a printed circuit board, or a substrate.

A method of manufacturing a component carrier, includes: forming a stack comprising at least one electrically conductive layer structure and/or at least one electrically insulating layer structure; embedding a component in the stack, wherein the component comprises at least one dielectric layer arranged on at least one main surface of the component and at least partially covering one or more pads of the component; and forming at least one opening in the dielectric layer and at least partially filling the at least one opening with at least one electrically conductive contact to thereby electrically connect at least one of the one or more pads of the component.

The method as described in the preceding paragraph is arranged with at least one of the following features: i) forming the at least one electrically conductive contact without previously connecting at least one further electrically insulating layer structure to the at least one dielectric layer; ii) the component is already provided with the at least one opening at the point of time of embedding the component, wherein the method in particular comprises at least partially filling the at least one opening with electrically conductive material after embedding the component; iii) forming the at least one opening by laser processing, in particular by laser drilling.

The method as described in the preceding paragraph further includes providing the stack with a cavity; closing at least part of a bottom of the cavity by a temporary carrier; and placing the component in the cavity so that at least one of the at least one dielectric layer is attached onto the temporary carrier.

The method as described in the preceding paragraph further includes at least partially filling a gap in the cavity between the component and the stack with a filling medium, in particular with an additional filling medium; thereafter removing the temporary carrier from the stack, the component and the filling medium.

The method as described in the preceding paragraph such that filling the gap is carried out by at least one of the group consisting of applying a liquid filling medium into the gap, and laminating an at least partially uncured electrically insulating layer structure to the stack and the component.

The An embodiment of a method of manufacturing a component carrier, includes: forming a stack comprising at least one electrically conductive layer structure and/or at least one electrically insulating layer structure; embedding a component in the stack, wherein the component comprises at least one dielectric layer arranged on at least one main surface of the component and at least partially covering one or more pads of the component; and forming at least one opening in the dielectric layer and at least partially filling the at least one opening with at least one electrically conductive contact to thereby electrically connect at least one of the one or more pads of the component. The method further includes the step of placing a bottom of the component on a flat support structure, in particular at least one of the layer structures of the stack or a temporary carrier; embedding the component between the flat support structure and at least one flat support structure covering a top of the component.

The method as described in the preceding paragraph where the embedding comprises pressing the component into at least one of the layer structures during the embedding.

The method as described in the preceding paragraph further comprising at least one of the following features: i) the at least one dielectric layer is in a fully cured state already prior to inserting the component with the at least one dielectric layer in the stack; ii) the at least one dielectric layer is in an at least partially uncured state when inserting the component with the at least one dielectric layer in the stack.

An embodiment of a method of manufacturing a component carrier, includes: forming a stack comprising at least one electrically conductive layer structure and/or at least one electrically insulating layer structure; embedding a component in the stack, wherein the component comprises at least one dielectric layer arranged on at least one main surface of the component and at least partially covering one or more pads of the component; and forming at least one opening in the dielectric layer and at least partially filling the at least one opening with at least one electrically conductive contact to thereby electrically connect at least one of the one or more pads of the component. The method further includes the step of inserting the component in the stack in a condition in which the at least one dielectric layer is a continuous layer.

The method as described in the preceding paragraph further including forming the at least one opening and the at least one electrically conductive contact after the inserting.

An embodiment of a method of manufacturing a component carrier, includes: forming a stack comprising at least one electrically conductive layer structure and/or at least one electrically insulating layer structure; embedding a component in the stack, wherein the component comprises at least one dielectric layer arranged on at least one main surface of the component and at least partially covering one or more pads of the component; and forming at least one opening in the dielectric layer and at least partially filling the at least one opening with at least one electrically conductive contact to thereby electrically connect at least one of the one or more pads of the component. The method further includes the step of connecting at least one further electrically insulating layer structure and/or at least one further electrically conductive layer structure to at least one of a top side and a bottom side of the stack.

An embodiment of a method of manufacturing a component carrier, includes: forming a stack comprising at least one electrically conductive layer structure and/or at least one electrically insulating layer structure; embedding a component in the stack, wherein the component comprises at least one dielectric layer arranged on at least one main surface of the component and at least partially covering one or more pads of the component; and forming at least one opening in the dielectric layer and at least partially filling the at least one opening with at least one electrically conductive contact to thereby electrically connect at least one of the one or more pads of the component. The method further includes the steps of providing the dielectric layer with an electrically insulating matrix and an additive comprising a metal compound, selectively treating a surface portion of the dielectric layer to thereby locally remove material of the electrically insulating matrix while simultaneously locally activating the additive for promoting subsequent metal deposition, and selectively depositing metallic material on the locally activated additive.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A method of manufacturing a component carrier, comprising:
   forming a stack comprising at least one electrically conductive layer structure and/or at least one electrically insulating layer structure;
   providing a component having one or more pads and at least one dielectric layer, such that the at least one dielectric layer is arranged on at least one main surface of the component and at least partially covering one or more pads of the component,
   wherein the at least one dielectric layer does not extend beyond the at least one main surface of the component in a lateral direction;
   placing a bottom of the component with the at least one dielectric layer on a temporary carrier to connect the component to the temporary carrier; and
   embedding the component between the temporary carrier and the at least one insulating layer structure.

2. The method according to claim 1, comprising at least one of the following features:
   wherein the method comprises forming the at least one electrically conductive contact without previously connecting at least one further electrically insulating layer structure to the at least one dielectric layer;
   wherein the component is already provided with the at least one opening at the point of time of embedding the component,
   wherein the method comprises at least partially filling the at least one opening with electrically conductive material after embedding the component;
   wherein the method comprises forming the at least one opening by laser processing.

3. The method according to claim 1, further comprising:
   after embedding, removing the temporary carrier from the stack and the at least one dielectric layer.

4. The method according to claim 1, further comprising at least one of the following features:
   wherein the at least one dielectric layer is in a fully cured state when arranged on the component;
   wherein the at least one dielectric layer is in an at least partially uncured state when arranged on the component.

5. The method of claim 1, further comprising:
   wherein the at least one dielectric layer is a continuous layer.

6. The method according to claim 1, further comprising:
   removing the temporary carrier;
   forming at least one opening in the at least one dielectric layer in registration with at least one pad.

7. The method according to claim 1, further comprising:
   connecting at least one further electrically insulating layer structure and/or at least one further electrically conductive layer structure to at least one of a top side and a bottom side of the stack.

8. The method according to claim 1, further comprising:
   providing the dielectric layer with an electrically insulating matrix and an additive comprising a metal compound;
   selectively treating a surface portion of the dielectric layer to thereby locally remove material of the electrically insulating matrix while simultaneously locally activating the additive for promoting subsequent metal deposition;
   selectively depositing metallic material on the locally activated additive.

9. The method according to claim 1,
   wherein during embedding, the component is not placed into a cavity but sandwiched between the temporary carrier and the at least one insulating layer structure which is a planar layer.

10. The method according to claim 1,
    wherein during embedding, a cavity is formed in the at least one insulating layer structure by pressing the component into the at least one insulating layer structure.

11. The method according to claim 1,
    wherein the at least one insulating layer structure is an at least partially uncured layer structure.

12. The method according to claim 11,
    wherein the embedding comprises laminating the at least one insulating layer structure to the component and the temporary carrier, and to another layer structure at the side of the at least one insulating layer structure opposite to the temporary carrier.

13. The method according to claim 1,
    wherein the component is pressed into the at least one insulating layer structure.

* * * * *